United States Patent [19]
Kunkel

[11] Patent Number: 5,895,885
[45] Date of Patent: Apr. 20, 1999

[54] AIR VENT FOR ELECTROMAGNETIC SHIELDING

[76] Inventor: George M. Kunkel, 8402 McGroarty, Sunland, Calif. 91040

[21] Appl. No.: 08/978,176

[22] Filed: Nov. 25, 1997

Related U.S. Application Data

[63] Continuation-in-part of application No. 08/999,781, Mar. 20, 1997.

[51] Int. Cl.⁶ .................................................. H05K 9/00
[52] U.S. Cl. ............................... 174/35 MS; 174/35 R
[58] Field of Search ............................. 454/184, 275, 454/276; 174/35 R, 35 MS; 428/116, 593; 219/738, 740

[56] References Cited

U.S. PATENT DOCUMENTS 4,851,608  7/1989  Seip ........................ 174/35 MS

FOREIGN PATENT DOCUMENTS 3-131092  6/1991  Japan ..................... 174/35 MS
8401200  11/1985  Netherlands .............. 174/35 MS

*Primary Examiner*—Harold Joyce
*Attorney, Agent, or Firm*—Donald D. Mon

[57] ABSTRACT

A honeycomb air vent panel for passage of air and for shielding of electromagnetic fields. The honeycomb is formed by metal undulations joined at central segments by an adhesive bond. The ends of the central segments are blended together to form a conductive-bridge between them. Members of a pair of these panels may be placed adjacent to each other with their end faces parallel and central segments crossed.

9 Claims, 3 Drawing Sheets

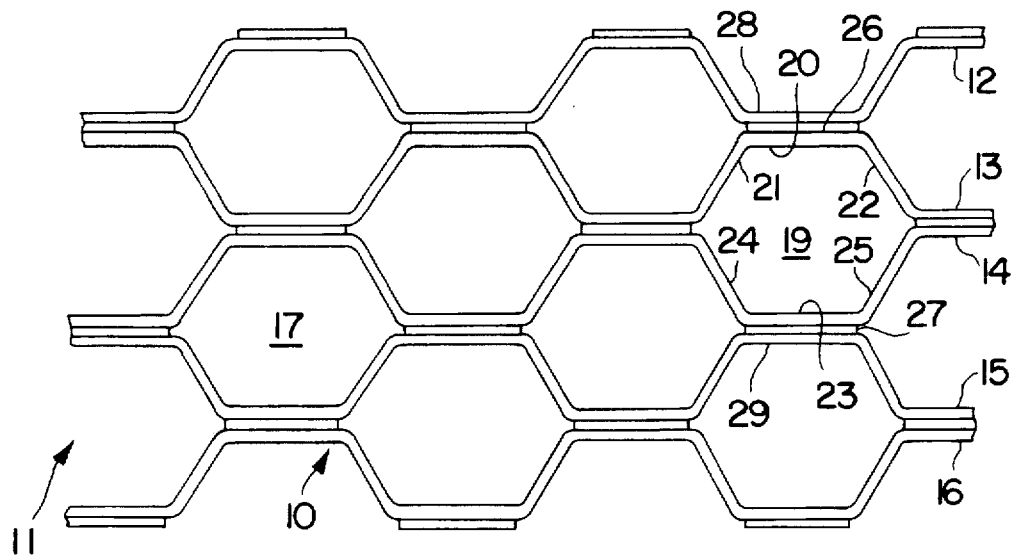
FIG. 1
PRIOR ART
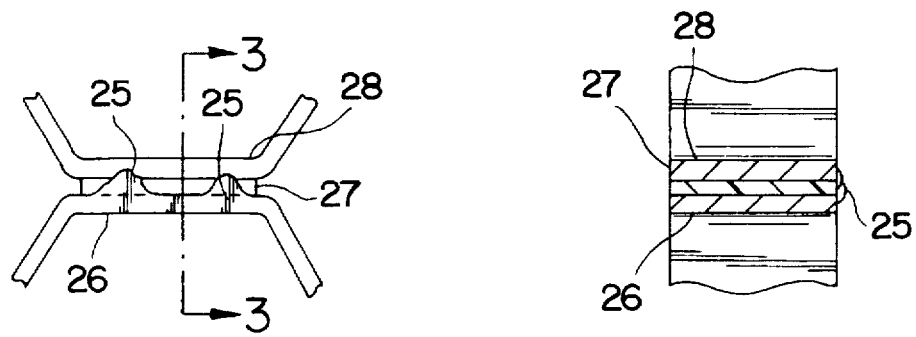
FIG. 2
PRIOR ART
FIG. 3
PRIOR ART
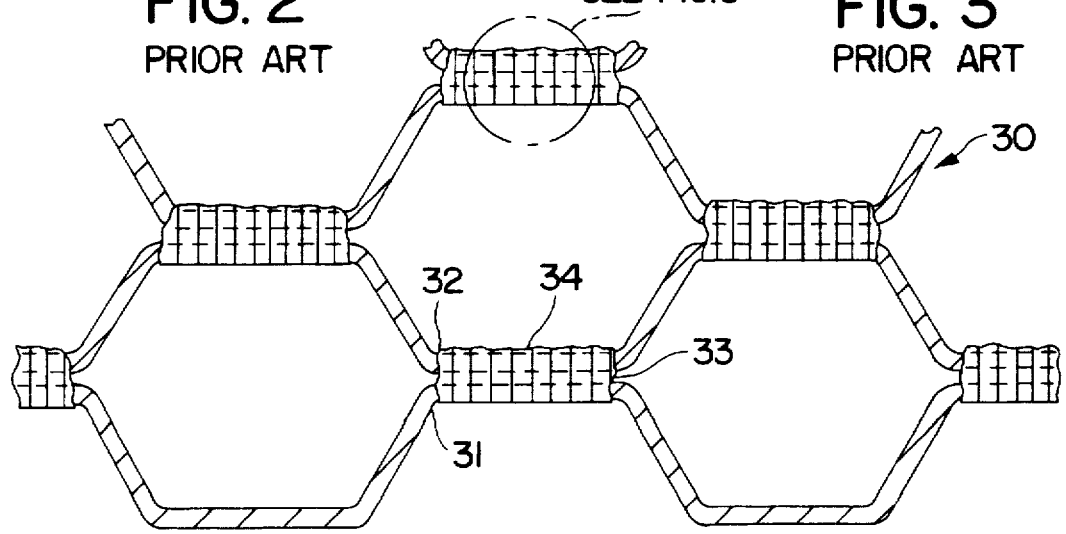
FIG. 4

5,895,885

1

AIR VENT FOR ELECTROMAGNETIC SHIELDING

This is a continuation-in-part of applicant's copending application Ser. No. 08/999,781 filed Mar. 20, 1997.

FIELD OF THE INVENTION

Panels to be placed across an air vent which permit flow of cooling air and also provide substantial and reliable electromagnetic shielding.

BACKGROUND OF THE INVENTION

It has long been known that when cost is no object, and the ultimate in electromagnetic shielding of air vents is necessary, that hexagonal metal honeycombs which are held together by soldering or welding are the material of choice. Because all abutting surfaces of the undulations of the hexagon that form the honeycomb pattern are held together by a conductive bond, the maximum electromagnetic shielding which can be derived from a body of honeycomb material is in fact attained.

Such material is very costly. Its cost can be justified for very critical installations, especially for military applications where cost is subordinate to reliability and capability. This is not the situation for most commercial (and also for many military) applications. For example, while an ultimate shielding of about 120 db at relatively high frequencies (1 GHz) can be attained with soldered or welded-together honeycomb structure there are many applications where only about 40 to 60 dB is necessary, and in which the cost of soldered or welded honeycomb for the panels cannot be justified.

This is not a new problem. Previous efforts have been made to utilize honeycomb which is constructed of undulations of metal foil which are joined at abutting segments by an epoxy resin. Such foils, without further treatment, do provide some shielding, perhaps as high as 60 db (at 1 GHz) but also as little as 30 db. This lack of reliability and consistency from panel to panel renders the use of such honeycomb filters unsuitable for many important applications where cost is a substantial criterion.

Honeycombs formed by joining adjacent undulations with an epoxy inherently conduct an electric current better in the direction of the undulations than across them. The undulations provide a continuous electrical circuit in their direction. However, the epoxy joinders between them are poor conductors, so the conductivity in the direction across them is poor.

Because the shielding property can be increased by conductively joining the undulations together, numerous ways conductively to join them have been suggested. One way is to pierce the abutting segments of the undulations with a probe (pin hole) that carries some of the metal from one undulation to its neighbor. This does provide some interconnection between the undulations, but its effect is rather small, and is not uniform, predictable or reliable.

Another means is by a relatively thick (0.0005 to 0.001 inches) electroless nickel-plating of the entire honeycomb structure. This can provide, while using an epoxy assembled honeycomb, performance nearly equal to that of a soldered or welded honeycomb. The problem is the cost. The surface area of the honeycomb is large, and therefore so is the cost of nickel-plating it. Due to the cost, one is as well off using the soldered or welded honeycomb.

Yet another suggested arrangement is to electroplate the honeycomb structure with a coating such as tin or cadmium.

2

Again the cost is relatively high, although not as high as the cost of a honeycomb whose entire surface has been nickel plated or having the undulations soldered or welded together. This arrangement has been known to add additional shielding to the conventional honeycomb panel. However, it can also suffer from the acid treatment which is involved. It only improves the "bridge" created by contact points of metal that result from the sawing operation used in creating panels from honeycomb blocks. These do provide some conductive connection, but if they are etched off in the electroplating process, the shielding quality of the conventional panel can be significantly reduced (a loss of as much as 40 dB is not unusual), and the result is therefore not uniform, predictable or reliable.

It is an object of this invention to provide a cost effective honeycomb panel by performing mechanical processes on the face of the panel, and whose shielding property is reliable and reproducible.

Honeycomb panel wafers are formed from slices cut from large blocks of honeycomb by a sawing operation. The teeth of the saw tend to sever the panel, and while they do, some of them pull shard-like portions of one undulation across the epoxy gap, where they touch against the opposite undulation. This provides a few conductive bridges between the abutting undulations. In practice the undulations are aluminum alloy about 0.002 inches thick, and the epoxy bond is about 0.0005 inches thick. However, the presence, location, and number of these bridges is random and not reliable. Their formation is subject to variations of the sharpness and accuracy of the teeth, the speed of the saw cut and the pressure of the saw against the honeycomb. With so many variables, repetitive consistency is not to be expected. Still, improvement in shielding performance is noticeable compared to a panel which does not have these bridges.

It is an object of this invention to perform a mechanical finishing operation on the face of a panel to provide a substantially continuous and reliable metal bridge from one undulation to its neighbor, the bridge being made of self-material from one of the undulations, thereby "blending" the undulations together at their ends to make a continuous and reliable metallic bridge between them, all of this at a modest cost.

As a consequence of a straight-forward mechanical operation on the face of a conventional panel which before the operation inconsistently and unreliably provided a shielding between about 30–60 dB at 1 GHz, a consistent and reliable product is made which provides shielding of about 70 dB. This panel is good enough for a large preponderance of shielding installations.

Still more advantage can be attained by improving the contact of the bridges with the farther undulations, to a reliable 85 dB—a thirty times improvement over the basic improved panel.

With the use of a pair of these improved panels arranged as described herein, reliable shielding of about 110 dB can be provided. This is a surprising and unpredictable 10,000 times improvement in shielding obtained by a simple mechanical treatment of the two faces of the panel, and using two of them in face to face contact with each other.

Further, with a separation of the two improved panels, another doubling of the shielding to 116 dB can be attained.

It will be rare for every feature to be used in the same panel or pair of panels. The results attainable with a selected one or two of the features will suffice for nearly every shielding requirement.

BRIEF DESCRIPTION OF THE INVENTION

A shielded air vent panel according to this invention is produced from wafers cut from honeycomb blocks. The honeycomb metal comprises undulations of metal foil that form hexagonal passages. Abutting parallel segments of undulations are joined together by an epoxy resin. The exposed end of the wafer presents a face consisting of a hexagonal pattern of honeycomb metal with segments of epoxy between and joining abutting central segments of the undulations. The central segments are parallel to each other. These abutting central segments are separated by the very thin epoxy layer, which joins them together.

According to a feature of this invention, some metal from the end of one of the abutting segments is displaced over the epoxy, against and blended into the metal of the adjacent (farther) abutting segment. This produces a substantially continuous and integral metallic bridge between each pair of abutting segments, and thereby conductively joins all surfaces of the honeycomb structure to one another. This is a significant improvement over the relatively small amount of bridging that results from the finger-like slivers which are created by the sawing operation that created the wafer.

According to a preferred feature of this invention, the blending is attained by mechanical movement of the bridging material across the epoxy gap. The presently-preferred means for the blending operation is by drawing a lightly abrasive material across the face of the panel, without appreciable removal of metal.

According to an optional feature of this invention, the shielding effect can greatly be increased by providing a plurality of panels with the respective major and minor axes of the hexagonal patterns arranged at an angle to each other, preferably normal to one another.

According to a preferred but optional feature of the invention, the panels are spaced apart from one another.

According to still another optional feature of the invention, the bridges are conductively connected to the farther segment so as physically to restrain them and maintain their structural contact with the farther central segment.

The above and other features of the invention will be fully understood from the following detailed description and the accompanying drawings, in which:

BRIEF DESCRIPTION OF THE DRAWINGS

FIG. 1 is an end view of an idealized panel of honeycomb material;

FIG. 2 is an enlarged fragment of FIG. 1, as it would appear as the consequence of being formed by a sawing operation;

FIG. 3 is a cross-section partly in schematic notation taken at line 3—3 in FIG. 2;

FIG. 4 is an end view of a panel according to this invention, shown partly in schematic notation;

DETAILED DESCRIPTION OF THE INVENTION

Figure 5:
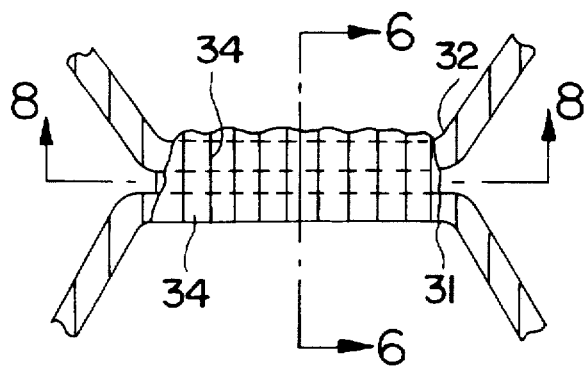
FIG. 5 is an enlarged fragment of FIG. 4.

The end face 10 of a block 11 of honeycomb material used in this invention to provide shielding to electromagnetic fields while enabling the flow of cooling air is shown in FIG. 1. This is a conventional material of construction. It comprises a series of undulations, of which five are shown in FIG. 1 for purposes of illustration. These are undulations 12, 13, 14, 15 and 16. The number actually used will be determined by the ultimate dimensions of the air vent opening. It is intended to extend across an air vent opening, with its many axial passages 17 permitting flow of air into the cooling system. Such systems are commonly provided on electronic devices such as computers, which must be kept cool, but which should not be subjected to or emit external electromagnetic fields.

The undulations are made of metal, usually aluminum or an aluminum alloy. They are identical, and are arranged in inverted order. For example, undulations 13 and 14 bound a passage 19 (a specific one of passages 17). Undulation 13 includes a central segment 20 and two side segments 21, 22. Undulation 14 includes a central segment 23 and two side segments 24, 25. Layers 26 and 27 of cured epoxy serve adhesively to bond central segments 20 and 23 to central segments 28 and 29, respectively, of undulations 12 and 15.

Examination of FIG. 1 will show that this adhesive joinder occurs wherever there are two abutting central segments throughout the honeycomb structure. The term "abutting" is used, even though a thin layer of epoxy is between the segments. The foil is usually about 0.002 inches thick, and the epoxy is usually about 0.0005 inches thick.

It is evident that in the theoretical structure shown in FIG. 1, each undulation is insulated from its neighbor by an epoxy layer. Actually, because these panels are formed by a saw cut made by a very accurate band saw, there will be at least a few tooth tracks across the epoxy layers and their contiguous central segments. This is schematically shown in FIG. 2, where sliver-like pieces 25 of metal from a central segment 26 are tracked as bridges across epoxy layer 27 to overlay and physically contact central segment 28. This contact between the central segments will provide some conductivity between the metal undulations and thus contribute to the shielding property. However, this often is minor and is highly variable. It cannot be relied on for protection of sensitive equipment.

Figure 6:
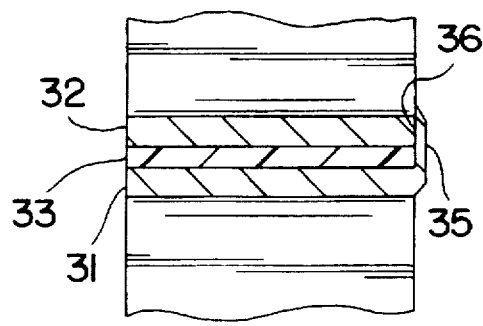
FIG. 6 is a cross-section, partly in schematic notation.

The purpose of this invention is reliably to create a conductive bridge between all abutting central segments, for substantially the full length of these central segments. This is accomplished by a mechanical surface treatment to the end faces 30 of a wafer honeycomb, a portion of which is shown in FIG. 4. As schematically shown in FIGS. 4–6, a mechanical displacement of some metal from one central segment 31 to its neighbor 32 across the intervening epoxy layer 33 has been made. The striated wave-like pattern 34 which results from this treatment is shown on all segments, including the side segments, but it is useless for this invention except at the central segments.

As can best be seen in FIG. 6, some metal 35 ("bridges") has been displaced from segment 31, and literally wiped, or smeared onto the epoxy layer and onto segment 32, the farther central segment. The resulting contact with segment 32 provides a conductive connection between the undulations.

This displacement can properly be called "blending" because it tends to blend the metal of one undulation against the metal of the other. While there will be little penetration into the farther central segment, still the interface is a tight one caused by pressure and mechanical work, which will now be described. This treatment is preferably made to both faces of the layer, although a panel whose wafer was treated on only one side is within the scope and concept of this invention.

Figure 7:
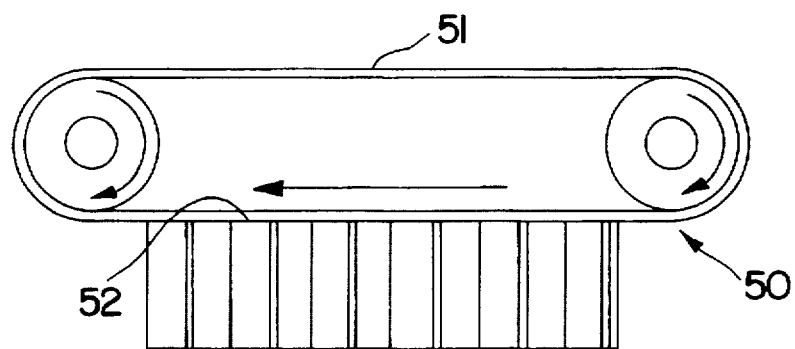
FIG. 7 is a side view, partly in schematic notation, showing the preferred method of making a panel according to the invention.
Figure 8:
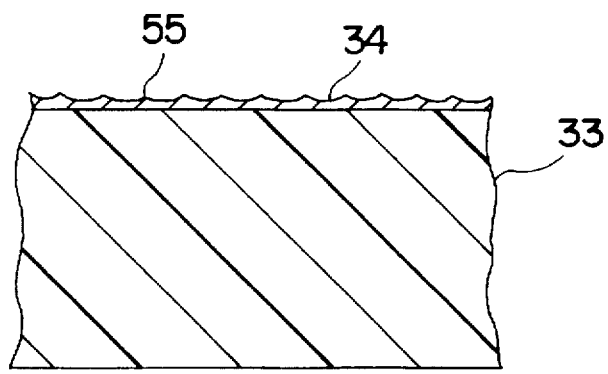
FIG. 8 is a cross-section schematically illustrating the general shape of the surface of the displaced metal.

The honeycomb material is relatively delicate, so that mechanical forces must be exerted with caution. For this invention, as shown in FIG. 7, a typical belt sander 50 drives a continuous belt 51 of blending material. This belt is sometimes called a "pad", because a driven belt is the best way to do this procedure. While the pad can be directed in any direction across the directed of a wafer 53, it is preferably directed across the grain, that is, normal to the central segments. This will provide the shortest path of useful displacement of material between the central segments, and the maximum length of contact along them.

The belt (pad) itself is preferably a non-woven, abrasive, surface-blending belt of the type frequently used for providing satin finishes on metal surfaces. Generally these are heavy-duty non-woven nylon belts, impregnated with aluminum oxide grits. A preferred example is the fine series with very fine 1000 grit sold by 3M Company. However, coarse to very fine grits have been shown to work successfully, even as coarse as 80 grit. Other types of belts, pads, or blending surfaces may be used instead so long as they create the necessary movement of metal.

The blending pad is not intended to remove either metal or epoxy, although it may do so to a small extent. Instead, the metal is to be deformed plastically by engagement of the grits and nylon structure of the pads, and smeared across, leaving a trail of grooves atop the displaced metal.

The result is to create a striated bridge pattern 55 across the joinder of central segments and epoxy. Viewed through a microscope it appears as a laterally undulating group of raised rounded wave-like ridges. These generally reach and sometimes extend beyond the farther edge of one of the central segments.

When only on face of a wafer is to be treated, it will most conveniently be done before slicing it from the block. The wafer may, of course first be separated, and then treated on both, or only on one side (face).

Whatever the exact action is, and its precise nature is not known, the resulting structure provides reliable shielding at a minor manufacturing cost. The explanation given is the best effort to describe the favorable result.

Figure 9:
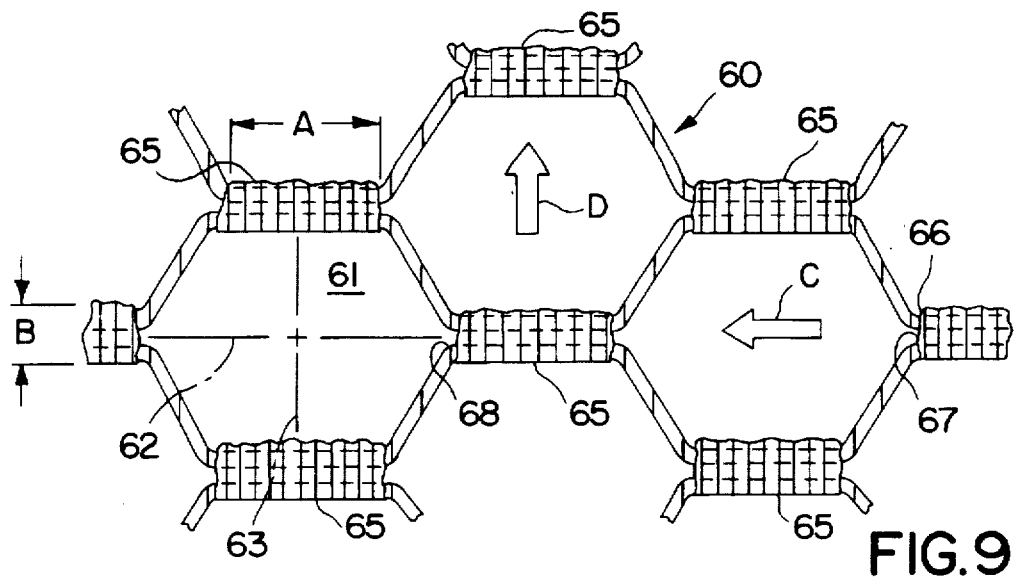
FIG. 9 is a semi-schematic view similar to FIG. 4 explaining certain features of the panel.

As best shown in Fig. 9 a panel 60 with all of the features of panel 30 in FIG. 4 is formed with openings 61 in the shape of hexagons. The hexagons are all substantially identical. Each includes a longer major axis 62 and a shorter minor axis 63.

Conductive bridges 65 extend between adjacent central segments 66,67. The central segments are bonded together by a non-conductive epoxy 68, all as set forth above.

Attention is called to the directions indicated by arrows C and D. These represent current flows in their respective direction from edge to edge of a panel formed with this honeycomb. Current in direction C, parallel to the major axes, flows readily through the continuous undulations. The insulation of the central segments by the epoxy is unimportant, and the conductive bridges add little advantage to flow of current in the direction C.

However, bridges 65 add importantly to conductivity in direction D, because they bridge across the epoxy. Without these bridges, the honeycomb exhibits a nearly polarized response in its reaction to induced currents in one or the other of the directions. The bridges greatly reduce the difference, by providing significant conductivity at the faces of the panel where the central segments abut.

A single panel according to this invention provides importantly improved shielding because of its increased conductivity in the direction D. Of course currents directed other than along arrows C and D are proportionally improved compared to conventional panels not provided with the bridges.

Figure 10:
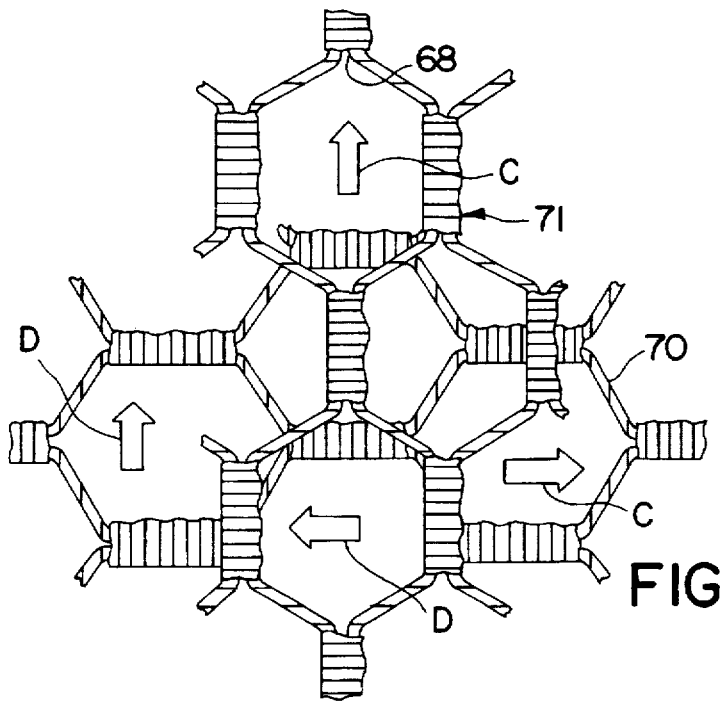
FIG. 10 is a plan view showing two parallel panels arranged according to a preferred feature of the invention.
Figure 11:
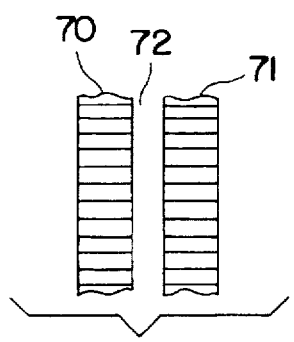
FIG. 11 is a side view of FIG. 10 with the panels shown in a preferred relationship to each other.
Figure 12:
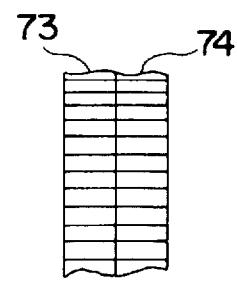
FIG. 12 is a side view of FIG. 10 with the panels shown in another relationship to each other.

According to this invention, unexpectedly large improvements can be provided by using a pair of panels according to this invention, as shown in FIGS. 10, 11 and 12. In FIG. 11, two panels 70 and 71 are spaced apart by a gap 72, and in FIG. 12, two panels 73 and 74 are placed in contact with one another.

Panels 70, 71, 73 and 74 are all made the same as panels 30 and 60. Importantly, as shown in FIG. 10, their directions C and D are normal to each other in plan view. Thus, in whatever direction the current is induced to flow, it will enjoy the advantages of the bridges. Directions C and D may be other than normal to each other, but the benefits of this invention will be reduced. Also, three or more may be used, but more than two panels do not add appreciably to the shielding effect.

The superior shielding attained with this invention will be appreciated from the following comparisons. These all relate to an aluminum alloy honeycomb joined by an epoxy and cut to size with a saw, as described herein. The panels are about ¼ inch thick, and the major axis of the hexagon is about ⅛ inch. The tests are made at 1 GHz.

1. A panel without the surface treatment of this invention 30–60 dB, unreliably and inconsistently from panel to panel.

2. A panel with surface treatment of this invention on both faces, about 70 dB, reliably and consistently from panel to panel.

3. A pair of panels with the surface treatment of this invention on both faces of each panel. The major axes normal to one another, and the adjacent faces pressed together, 110 dB, reliably and consistently from pair to pair. This is a 10,000 times improvement in power reduction over the panels used singly.

4. A pair of panels with the surface treatment of this invention, with the major axes normal to one another, and the adjacent faces parallel and spaced about ⅛ to ¼ inch apart, 116 dB. This approximately 2 times improvement over example 3 will rarely be favored because of the requirement for a more complicated frame for the panels, and the increased expense, the results attainable with example 3 being sufficient for all but a very few applications.

Because the connection of the bridges to the farther central segments are primarily mechanical, improved conductivity can be expected if a face that has the bridges is treated by a technique which will provide a more intimate contact, and perhaps one that adds to the mechanical strength. Soldering and welding of the bridge material to the farther central segment will do this. So will a relatively thin plating process which deposits a layer of conductive metal, perhaps nickel copper or tin that adheres to and connects the blended material and the central segments.

A thin (0.0001 inch) plating can yield a shielding by the panel of example 2 of about 85 dB, or a thirty-times improvement over the panel without the plating. Because 70 dB is more than sufficient for most uses, and 110 dB can readily be attained by using two of them, the cost of the plating treatment will rarely be justified, but the advantage does exit.

Denoting the sawing-off of the wafer as a primary operation, the blending operation as a secondary operation, and the subsequent treatment of the end faces by plating, welding or soldering as a tertiary operation, the value of a tertiary operation can now be assessed.

The product of the secondary operation is a mechanical abutment of metal displaced from one central segment across the epoxy and upon the farther central segment. This is an intimate bond created by an active force that placed the relatively soft material in a close conductive contact. However, while it does have some property of a physical bond as a consequence of the smearing forces, still it can be loosened somewhat. While this reduction is not enough to reduce the shielding effect below design limits, a tertiary operation may avoid it almost entirely.

Plating, welding and soldering operations can create an intimate and continuous physical bond. The minor improvement in shielding will rarely justify the cost of these operations, especially because any long-term reduction in efficiency of the panel made with only the secondary operation is still well within limits. For this reason, tertiary operations will be needed only very infrequently, but are still within the scope of this invention.

This invention is not to be limited by the embodiments shown in the drawings and described in the description, which are given by way of example and not of limitation, but only in accordance with the scope of the appended claims.

I claim:

1. An air vent panel assembly comprising:
    a pair of air vent panels for passage of air and for shielding of electromagnetic field, each panel comprising a honeycomb body made of a plurality of metal undulations, each undulation having a central segment and two side segments that together form axially extending hexagonally shaped air passages when a plurality of undulations are laid against one another with their central segments in parallel adjacency to one another, said central segments being joined together by an adhesive bond, said body having a laterally cut end face which exposes cross-sections of said undulations and adhesive bonds, the improvement comprising:
    a blended displacement of a portion of the exposed cross-section of the central segment of one of said undulations across said adhesive bond and upon said exposed cross-section of the central segment of the other said undulation thereby to form a conductive bridge between said two central segments, said bridge extending for substantially the full length of said central segments;
    each said panel having a pair of said panel faces, said panels being placed with their faces parallel to each other and with their central segments disposed non-parallel to each other when viewed perpendicularly to said faces.

2. An assembly according to claim 1 in which adjacent faces of said panels are placed against one another.

3. An assembly according to claim 1 in which adjacent faces of said panels are spaced apart from one another.

4. As assembly according to claim 1 in which said central segments of one of said panels are normal to said central segments of an adjacent panel when they are viewed perpendicularly to said faces.

5. An assembly according to claim 4 in which adjacent faces of said panels are placed against one another.

6. An assembly according to claim 4 in which adjacent faces of said panels are spaced apart from one another.

7. An assembly according to claim 1 in which at least one face of at least one of said panels has been treated by a tertiary operation in which said conductive bridges are conductively bonded to said other central segments.

8. In an air vent panel for passage of air and for shielding of electromagnetic field comprising a honeycomb body made of a plurality of metal undulations, each having a central segment and two side segments that together form axially extending hexagonally shaped air passages when a plurality of undulations are laid against one another with their central segments in parallel adjacency to one another, said central segments being joined together by an adhesive bond, said body having a laterally cut end face produced by a primary cutting operation which exposes cross-sections of said undulations and adhesive bonds, the improvement comprising:
    a blended displacement of a portion of the exposed cross-section of the central segment of one of said undulations across said adhesive bond and upon said exposed cross-section of the central segment of the other said undulation by a secondary operation thereby to form a conductive bridge between said two central segments, said bridge extending for substantially the full length of said central segments; and
    a physical bond between the displaced material and said other central segment created by a tertiary operation selected from the group consisting of plating, soldering and welding.

9. A panel according to claim 8 in which said displacement is a mechanically caused movement of the metal of one of said segments, which exists at substantially all of the pairs of abutting central segments.

* * * * *